(12) United States Patent
Ito

(10) Patent No.: US 9,240,540 B2
(45) Date of Patent: Jan. 19, 2016

(54) PIEZOELECTRIC DEVICE

(71) Applicant: Murata Manufacturing Co., Ltd., Nagaokakyo-shi, Kyoto-fu (JP)

(72) Inventor: Korekiyo Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 184 days.

(21) Appl. No.: 14/071,683

(22) Filed: Nov. 5, 2013

(65) Prior Publication Data

US 2014/0055008 A1 Feb. 27, 2014

Related U.S. Application Data

(60) Division of application No. 13/473,937, filed on May 17, 2012, now Pat. No. 8,601,657, which is a continuation of application No. PCT/JP2010/070765, filed on Nov. 22, 2010.

(30) Foreign Application Priority Data

Nov. 26, 2009 (JP) .................................. 2009-268917

(51) Int. Cl.
*H01L 41/08* (2006.01)
*H01L 41/053* (2006.01)
(Continued)

(52) U.S. Cl.
CPC ............. *H01L 41/053* (2013.01); *H01L 41/18* (2013.01); *H01L 41/313* (2013.01); *H03H 3/02* (2013.01); *H03H 3/08* (2013.01); *H03H 9/02007* (2013.01); *H03H 9/02574* (2013.01); *H03H 9/05* (2013.01); *H03H 2003/021* (2013.01);
(Continued)

(58) Field of Classification Search
USPC ......................................... 310/358, 328, 313
See application file for complete search history.

(56) References Cited

U.S. PATENT DOCUMENTS 5,719,607 A * 2/1998 Hasegawa et al. .............. 347/70
6,445,265 B1 9/2002 Wright
(Continued)

FOREIGN PATENT DOCUMENTS

CN 1294780 A 5/2001
CN 1667946 A 9/2005
(Continued)

OTHER PUBLICATIONS

Official Communication issued in corresponding Japanese Patent Application No. 2014-084425, mailed on Feb. 3, 2015.
(Continued)

*Primary Examiner* — J. San Martin
(74) *Attorney, Agent, or Firm* — Keating & Bennett, LLP

(57) ABSTRACT

In a piezoelectric device and a method of manufacturing thereof, after an ion implanted portion is formed in a piezoelectric single crystal substrate by implantation of hydrogen ions, an interlayer of a metal is formed on a rear surface of the piezoelectric single crystal substrate. In addition, a support member is bonded to the piezoelectric single crystal substrate with the interlayer interposed therebetween. A composite piezoelectric body in which the ion implanted portion is formed is heated at about 450° C. to about 700° C. to oxidize the metal of the interlayer so as to decrease the conductivity thereof. Accordingly, the conductivity of the interlayer is decreased, so that a piezoelectric device having excellent resonance characteristics is provided.

8 Claims, 8 Drawing Sheets

(51) Int. Cl.

| | |
|---|---|
| *H03H 3/02* | (2006.01) |
| *H03H 3/08* | (2006.01) |
| *H03H 9/02* | (2006.01) |
| *H01L 41/313* | (2013.01) |
| *H01L 41/18* | (2006.01) |
| *H03H 9/05* | (2006.01) |

(52) U.S. Cl.
CPC ........... *Y10T 29/42* (2015.01); *Y10T 29/49126* (2015.01); *Y10T 156/1153* (2015.01)

(56) References Cited

U.S. PATENT DOCUMENTS

| | | |
|---|---|---|
| 2002/0047497 A1 | 4/2002 | Higuchi et al. |
| 2003/0011280 A1 | 1/2003 | Nakahata et al. |
| 2003/0199105 A1 | 10/2003 | Kub et al. |
| 2004/0226162 A1 | 11/2004 | Miura et al. |
| 2004/0233017 A1 | 11/2004 | Iwashita et al. |
| 2005/0116352 A1 | 6/2005 | Warashina et al. |
| 2005/0200234 A1 | 9/2005 | Sobu et al. |
| 2005/0200235 A1 | 9/2005 | Higuchi et al. |
| 2006/0169196 A1 | 8/2006 | Shiono |
| 2009/0015109 A1* | 1/2009 | Schuh .......................... 310/364 |

FOREIGN PATENT DOCUMENTS

| | | |
|---|---|---|
| CN | 1754014 A | 3/2006 |
| EP | 1 478 089 A1 | 11/2004 |
| JP | 10-322158 A | 12/1998 |
| JP | 2002-57549 A | 2/2002 |
| JP | 2002-176331 A | 6/2002 |
| JP | 2004-343359 A | 12/2004 |
| JP | 2005-167969 A | 6/2005 |
| WO | 2009/081651 A1 | 7/2009 |

OTHER PUBLICATIONS

Official Communication issued in corresponding European Patent Application No. 10833163.8, mailed on Jan. 23, 2014.
Korekiyo, "Piezoelectric Device and Method for Manufacturing the Same", U.S. Appl. No. 13/473,937, filed May 17, 2012.
Official Communication issued in corresponding Chinese Patent Application No. 201080052988.6 mailed on Sep. 3, 2014.

* cited by examiner

PIEZOELECTRIC DEVICE

BACKGROUND OF THE INVENTION

1. Field of the Invention

The present invention relates to a piezoelectric device including a piezoelectric single-crystal thin film and a support member supporting the thin film and a method for manufacturing the piezoelectric device.

2. Description of the Related Art

At present, many piezoelectric devices including a piezoelectric single-crystal thin film have been developed. In the piezoelectric device including a piezoelectric thin film as described above, in general, the piezoelectric thin film is bonded to a support member and is supported thereby. As a method for bonding a support member and a piezoelectric thin film to have a practical strength, for example, a bonding method in which a metal interlayer is provided at a bonding interface has been described (see, for example, Japanese Unexamined Patent Application Publication No. 2007-324195).

However, in a piezoelectric device including a piezoelectric thin film, when a metal interlayer is provided at a bonding interface between the piezoelectric thin film and a support member, the interlayer functions as a conductive layer, and resonance characteristics are disadvantageously degraded.

SUMMARY OF THE INVENTION

To overcome the problems described above, preferred embodiments of the present invention provide a piezoelectric device, the resonance characteristics of which are not degraded even if a bonding interlayer is provided between a piezoelectric thin film and a support member, and a method for manufacturing the piezoelectric device.

Preferred embodiments of the present invention provide a piezoelectric device including a piezoelectric thin film on which electrodes are provided and a support member supporting the piezoelectric thin film. The piezoelectric device preferably includes an interlayer including an oxidized or a nitrided metal between the piezoelectric thin film and the support member.

Since the metal interlayer is provided between a piezoelectric substrate and the support member, the piezoelectric substrate and the support member can be reliably adhered to each other. In addition, since the metal of the interlayer is oxidized after the piezoelectric substrate and the support member are bonded to each other, the interlayer has a decreased conductivity and defines an insulating layer. Thus, a piezoelectric device having excellent resonance characteristics is provided.

In preferred embodiments of the present invention, the oxidized or the nitrided metal is preferably made of at least one element selected from Fe, Cr, Ni, Al, W, and Cu, for example. When at least one element selected from Fe, Cr, Ni, Al, W, and Cu is included as a material of the interlayer, the adhesion can be increased when the support member and the piezoelectric thin film are bonded to each other. In addition, since these elements are each sufficiently oxidized by heating, the interlayer is formed into an insulating layer, and the piezoelectricity of the piezoelectric single crystal substrate is prevented from being degraded.

In preferred embodiments of the present invention, the thickness of the interlayer is preferably about 2 nm to about 25 nm, for example. If the thickness of the interlayer is set to less than about 2 nm, the piezoelectric substrate and the support member are not sufficiently bonded to each other. In addition, when the thickness of the interlayer is more than about 25 nm, even if the metal of the interlayer is sufficiently oxidized or nitrided by a heat treatment, a reduction of the piezoelectric single crystal substrate occurs by the presence of the interlayer, and the conductivity is increased. Thus, the characteristics of the piezoelectric device are degraded. On the other hand, if the thickness of the interlayer is set in the range of about 2 nm to about 25 nm, for example, bonding can be performed without causing any problems, and the resonance characteristics of the piezoelectric device are not degraded. Therefore, a piezoelectric device having excellent resonance characteristics is provided.

In a preferred embodiment of the present invention, the piezoelectric thin film is preferably made of lithium tantalate or lithium niobate, for example. Since lithium tantalate and lithium niobate each include oxygen, oxidation of the metal of the interlayer is promoted when the interlayer is heated, and the interlayer has a decreased conductivity and is formed as an insulating layer, so that a piezoelectric device having excellent resonance characteristics is provided.

In a preferred embodiment of the present invention, the conductivity of the piezoelectric thin film is preferably about $1.0 \times 10^{-13} \, \Omega^{-1} \cdot m^{-1}$ to about $1.0 \times 10^{-11} \, \Omega^{-1} \cdot m^{-1}$, for example. In this structure, since the piezoelectric substrate has the above conductivity, while the pyroelectric destruction is minimized or prevented during a process, oxygen atoms in the piezoelectric substrate which contribute to the oxidation in a heat treatment are sufficiently supplied. Thus, the interlayer can be reliably oxidized, and the resonance characteristics of the piezoelectric device can be improved.

A preferred embodiment of present invention provides a method for manufacturing a piezoelectric device including a piezoelectric thin film on which electrodes are formed and a support member supporting the piezoelectric thin film. The method for manufacturing a piezoelectric device preferably includes an ion implantation step, an interlayer formation step, a bonding step, a separation step, and a heat treatment step. In the ion implantation step, an ionized element is implanted in a piezoelectric substrate to form a portion in the piezoelectric substrate in which the implanted element has a peak concentration. The interlayer formation step forms an interlayer including a metal on at least one of the piezoelectric substrate or the support member supporting the piezoelectric substrate. The bonding step bonds the piezoelectric substrate and the support member with the interlayer interposed therebetween. In the separation step, the piezoelectric substrate is heated, and a piezoelectric thin film is separated using the portion in which the element implanted in the piezoelectric substrate has a peak concentration as a separation surface. In the heat treatment step, the interlayer is oxidized or nitrided by heating.

Since the metal interlayer is formed, the piezoelectric substrate and the support member are reliably adhered to each other. In addition, since the metal of the interlayer is oxidized, the conductivity of the interlayer is decreased, and the resonance characteristics are not degraded, so that a piezoelectric device having excellent resonance characteristics is manufactured.

In preferred embodiments of the present invention, a piezoelectric composite in which the piezoelectric thin film and the support member are bonded to each other with the interlayer interposed therebetween is preferably heated at about 450° C. to about 700° C., for example, in the heat treatment step. Since the piezoelectric composite is preferably heated at the above-identified temperature, the metal of the interlayer is sufficiently oxidized or nitrided, and the interlayer has a decreased conductivity and is formed as an insulating layer, so that a piezoelectric device having excellent characteristics is manufactured.

In preferred embodiments of the present invention, the piezoelectric composite in which the piezoelectric thin film and the support member are bonded to each other with the interlayer interposed therebetween is preferably heated at the Curie temperature or less of a material of the piezoelectric thin film, for example, in the heat treatment step. When the material of the piezoelectric thin film is heated at a temperature higher than the Curie temperature, although the polarization is eliminated, when heating is performed at the Curie temperature or less, the polarization is not eliminated. Thus, without increasing the number of steps, such as a polarization treatment, a piezoelectric device having excellent characteristics is manufactured.

According to various preferred embodiments of the present invention, since the piezoelectric thin film and the support member are bonded to each other with the interlayer including a metal interposed therebetween, and the metal of the interlayer is oxidized or nitrided after the bonding, the interlayer is not formed into a conductive layer, and a piezoelectric device having resonance characteristics which are not degraded and a method for manufacturing the piezoelectric device are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A method for manufacturing a piezoelectric device according to a first preferred embodiment of the present invention will be described with reference to the drawings. In the following description, as the piezoelectric device, a surface acoustic wave (SAW) device will be described by way of example.

Figure 1:
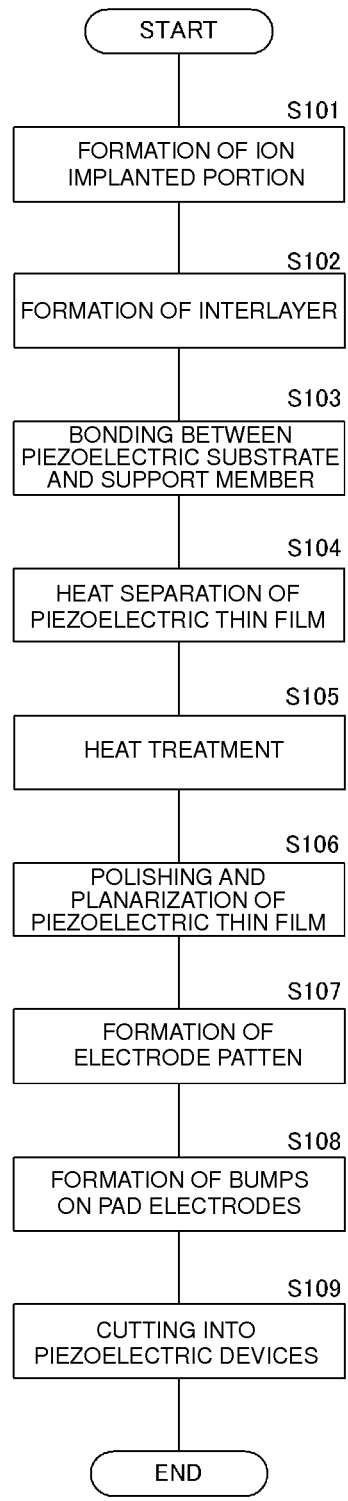
FIG. 1 is a flowchart showing a method for manufacturing a thin film piezoelectric device according to a first preferred embodiment of the present invention.

FIG. 1 is a flowchart showing the method for manufacturing a piezoelectric device according to the first preferred embodiment of the present invention. FIGS. 2A to 3D include schematic views showing manufacturing steps of the piezoelectric device formed along the manufacturing flow shown in FIG. 1.

First, a piezoelectric single crystal substrate 1 having a predetermined thickness is prepared. In this step, as the piezoelectric single crystal substrate 1, preferably, a substrate is used which has a mirror-polished rear surface 12 and an area on which a plurality of single piezoelectric devices can be arranged. In addition, as the piezoelectric single crystal substrate 1, an example will be described in which a single crystal substrate of $LiTaO_3$ or lithium tantalate (hereinafter, referred to as "LT substrate"), which has remarkably high brittleness and cleavability and is a difficult-to-process material, is preferably used.

Figure 2A:
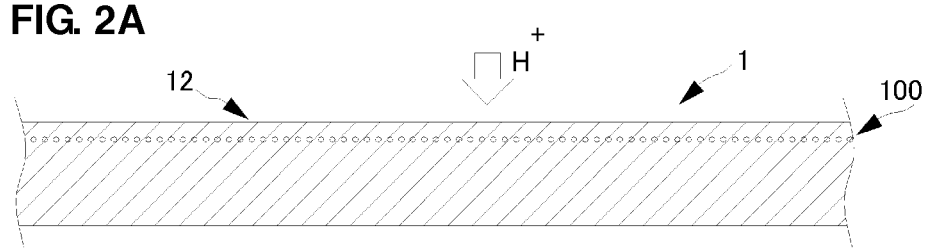
FIGS. 2A to 2C are schematic views showing manufacturing steps of the thin film piezoelectric device formed along the manufacturing flow shown in FIG. 1.

As shown in FIG. 2A, hydrogen ions ($H^+$) are implanted from a rear surface 12 side of the piezoelectric single crystal substrate 1 to form an ion implanted portion 100 in the piezoelectric single crystal substrate 1 (FIG. 1: S101).

If hydrogen ions are implanted at an implantation energy of about 150 keV and a dose (ion implantation density) of about $1.0 \times 10^{17}$ atom/cm$^2$, for example, when the piezoelectric single crystal substrate 1 is an LT substrate, the ion implanted portion 100 in which hydrogen ions are distributed is formed at a depth of approximately 1 μm, for example, from the rear surface 12. This ion implanted portion 100 is a portion in which the ion element implanted in the piezoelectric single crystal substrate has a peak concentration. In addition, besides the LT substrate, for example, an LN ($LiNbO_3$: lithium niobate) substrate, an LBO ($Li_2B_4O_7$) substrate, a langasite ($La_3Ga_5SiO_{14}$) substrate, and a KN ($KNbO_3$) substrate may also be used for the piezoelectric single crystal substrate 1, and ion implantation is performed therein under conditions in accordance with each substrate. In addition, in accordance with the type of a substrate, implantation ions may be changed to helium ions, argon ions, or other suitable ions.

Figure 2B:
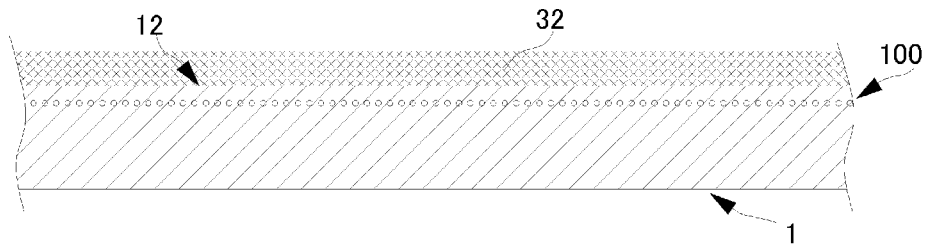

As shown in FIG. 2B, on a bonding surface of the piezoelectric single crystal substrate 1, a metal interlayer 32 is formed (FIG. 1: S102). As a material of the interlayer 32, a material which increases adhesion of the bonding, which is sufficiently oxidized by a heat treatment which will be described later, and which does not degrade the piezoelectricity of the piezoelectric single crystal substrate 1 is preferably used. As a metal having the characteristics as described above, for example, Fe, Cr, Ni, Al, W, and Cu may be used, and the interlayer 32 is preferably formed from at least one of these elements. The interlayer 32 preferably has a thickness of about 2 nm to about 25 nm, for example. This is based on the following experimental results. That is, when a support member 30 and the piezoelectric single crystal substrate 1 were bonded in the following bonding step, if the thickness of the interlayer was set to less than about 2 nm, the bonding could not be performed. On the other hand, when the thickness of the interlayer was set in the ranged of about 2 nm to about 25 nm, the bonding was performed without causing any problems. In addition, although the conductivity was decreased by oxidation or nitridation of the metal of the interlayer in the heat treatment step which will be described later, the conductivity was not increased by reduction of the piezoelectric single crystal substrate, and the resonance characteristics of the SAW device were not degraded. However, when the thickness of the interlayer was more than about 25 nm, even if the metal of the interlayer was sufficiently oxidized or nitrided by the heat treatment, the conductivity was increased since the piezoelectric single crystal substrate was reduced by the interlayer, and degradation of the resonance characteristics of the SAW device occurred. From the above experimental results, the thickness of the interlayer is preferably in the range of about 2 nm to about 25 nm, for example.

The interlayer 32 is preferably formed by sputtering, EB vacuum evaporation, CVD, or ion plating, for example. Alternatively, when clean bonding is performed in a bonding apparatus in the bonding step which will be described late, the interlayer 32 may be formed by etching a component of the bonding apparatus or a metal material of the interlayer.

Next, the support member 30 is prepared. As a material of the support member 30, for example, LT ($LiTaO_3$), LN ($LiNbO_3$), alumina, rock crystal, quartz, and aluminum nitride may preferably be used. Since these materials include oxygen or nitrogen, these materials promote oxidation or nitridation of the interlayer in the heat treatment which will be described later. In the heat treatment described later, in order to avoid the generation of warping and cracking of the substrate due to the difference in coefficient of linear expansion, LT, LN, and alumina, for example, each of which has a coefficient of linear expansion similar to that of a piezoelectric single crystal material, are preferably used as a material of the support member 30. In addition, in accordance with the material used for the support member, a film of silicon nitride, silicon oxide, alumina, aluminum nitride, or other suitable material may be formed on a bonding surface of the support member 30. Furthermore, by selection of the material of the support member, the temperature characteristics and the heat dissipation characteristics of the substrate are improved. In addition, the interlayer 32 may be formed on at least one of the bonding surface of the piezoelectric single crystal substrate 1 and the bonding surface of the support member 30 or both of them.

Figure 2C:
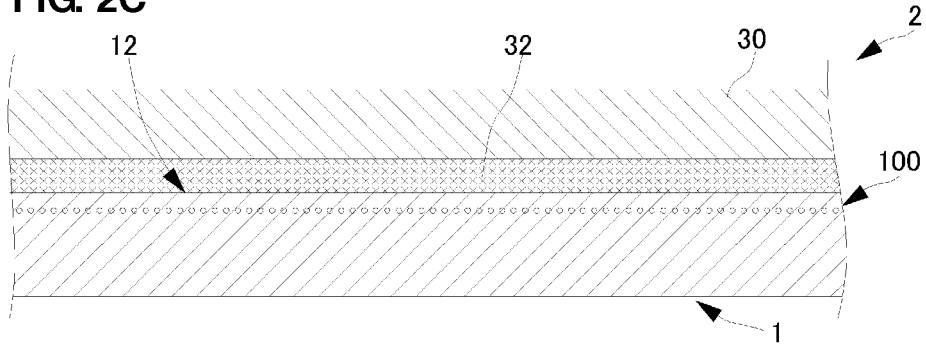

As shown in FIG. 2C, the support member 30 is directly bonded to the interlayer 32 formed on the rear surface 12 of the piezoelectric single crystal substrate 1 in a vacuum using a clean bonding technique to form a composite piezoelectric body 2 (FIG. 1: S103). The clean bonding is a bonding method for performing bonding in a state in which a bonding surface is activated by irradiation of Ar ions or other suitable ions in a vacuum, and heating is not required. Since a heat treatment step of removing hydrogen used in, for example, hydrophilic bonding, is not required in the bonding method as described above, degradation in piezoelectricity of the piezoelectric single crystal substrate and generation of stress due to the difference in coefficient of linear expansion between the support member and the piezoelectric single crystal substrate preferably will not occur.

Figure 3A:
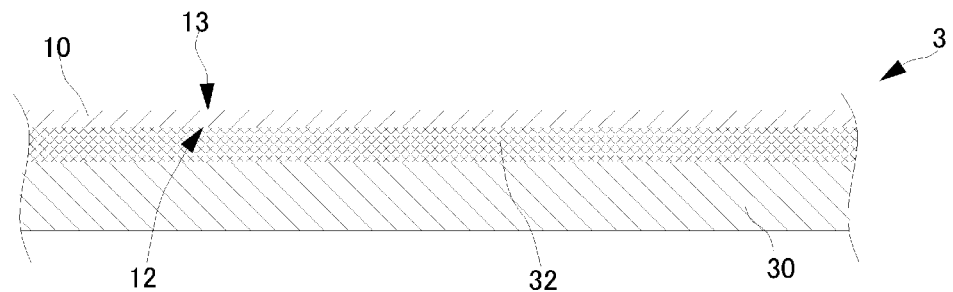
FIGS. 3A to 3D are schematic views showing manufacturing steps of the thin film piezoelectric device formed along the manufacturing flow shown in FIG. 1.

As shown in FIG. 3A, the composite piezoelectric body 2 is heated to about 250° C. or more, for example, and the separation is performed using the ion implanted portion 100 as a separation surface (FIG. 1: S104). The ion implanted portion 100 is a layer in which hydrogen ions are implanted at a depth of about 1 μm, for example, from the rear surface 12 of the piezoelectric single crystal substrate 1, and microcavities are generated along the surface of the substrate and are allowed to grow by heating. Accordingly, a piezoelectric thin film 10 is separated from the piezoelectric single crystal substrate 1, and a composite piezoelectric substrate 3 including the support member 30, the interlayer 32, and the piezoelectric thin film 10, and a piezoelectric single crystal substrate (LT substrate) (not shown) are formed. Although an LT substrate and an LN substrate have remarkably high brittleness and cleavability and are each a difficult-to-process material, when the above method is used, a piezoelectric thin film can be separated without damaging the substrate.

In addition, if heating is performed in a reduced pressure atmosphere in this case, the heating temperature can be decreased.

Subsequently, by performing the heat treatment of the composite piezoelectric substrate 3, the metal of the interlayer 32 is oxidized by oxygen included in the piezoelectric thin film 10 and the support member 30 to increase the insulating properties of the interlayer 32, thereby forming the interlayer 32 into an insulating layer (FIG. 1: S105).

In general, when an LT substrate is used for the piezoelectric thin film, in order to suppress the pyroelectricity, the LT substrate is reduced so as to decrease the insulating properties. However, since oxygen is not sufficiently supplied to the interlayer 32 from the piezoelectric thin film 10 when the LT substrate is excessively reduced, even if the heat treatment is performed, the interlayer 32 still has conductivity, and the characteristics of the SAW device cannot be improved. Thus, the conductivity of the piezoelectric thin film 10 must be adjusted.

Figure 4A:
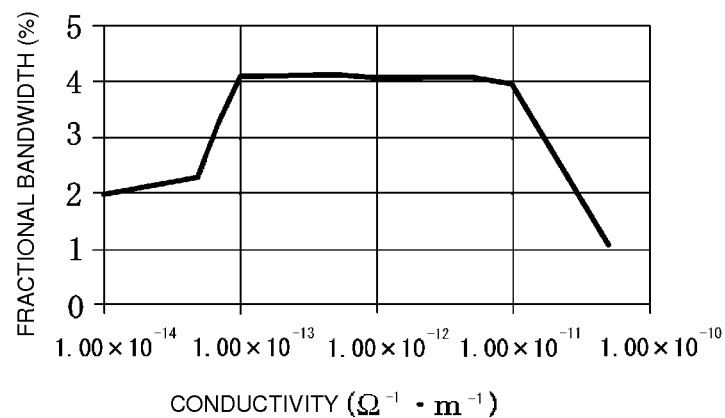
FIG. 4A is a graph showing the relationship between the fractional bandwidth and the conductivity of the piezoelectric device according to the first preferred embodiment of the present invention.
Figure 4B:
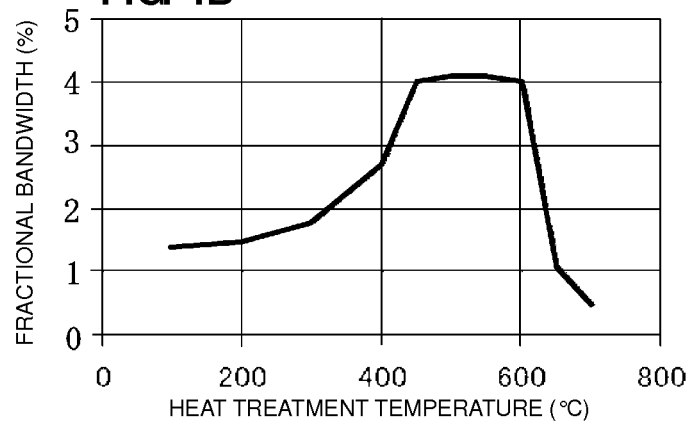
FIG. 4B is a graph showing the relationship between the fractional bandwidth and the heat treatment temperature of the piezoelectric device according to the first preferred embodiment of the present invention.

FIG. 4A is a graph showing the relationship between the fractional bandwidth and the conductivity of the piezoelectric device according to the first preferred embodiment of the present invention, and FIG. 4B is a graph showing the relationship between the fractional bandwidth and the heat treatment temperature of the piezoelectric device according to the first preferred embodiment of the present invention.

As shown in FIG. 4A, when the conductivity of the piezoelectric thin film was set to about $5 \times 10^{-14}$ $\Omega^{-1} \cdot m^{-1}$ or less, the pyroelectric destruction of an IDT electrode occurred in a manufacturing process of the SAW device, and the resonance characteristics were degraded. On the other hand, when the conductivity of the piezoelectric thin film was set in a range of about $1.0 \times 10^{-13}$ $\Omega^{-1} \cdot m^{-1}$ to about $1.0 \times 10^{-11}$ $\Omega^{-1} \cdot m^{-1}$, since oxygen atoms in the piezoelectric substrate which contribute to the oxidation in the heat treatment are sufficiently supplied while the pyroelectric destruction is prevented in the process, the characteristics of the SAW device are improved. However, when the conductivity of the piezoelectric thin film was set to about $5.0 \times 10^{-11}$ $\Omega^{-1} \cdot m^{-1}$ or more, since the conductivity of the LT substrate was too high, the resonance characteristics of the SAW device were degraded. However, even when the conductivity of the piezoelectric thin film was about $5.0 \times 10^{-11}$ $\Omega^{-1} \cdot m^{-1}$ or more, if the conductivity of LT at the surface of the support member 30 was about $1.0 \times 10^{-11}$ $\Omega^{-1} \cdot m^{-1}$ or less, the interlayer 32 was sufficiently oxidized by oxygen included in the support member 30, and degradation of characteristics by the conductivity of the interlayer was minimized or prevented. Therefore, a piezoelectric thin film having a conductivity of about $1.0 \times 10^{-13}$ $\Omega^{-1} \cdot m^{-1}$ to about $1.0 \times 10^{-11}$ $\Omega^{-1} \cdot m^{-1}$, for example, is preferably used.

In addition, as shown in FIG. 4B, when the temperature of the heat treatment was set to less than about 450° C., since a H gas or a He gas by ion implantation was not removed, or damage to the crystallinity of the piezoelectric thin film by ion implantation is not completely recovered, the resonance characteristics were not improved. However, since the metal of the interlayer was sufficiently oxidized or nitrided when the temperature of the heat treatment was set to about 450° C. or more, the resonance characteristics were improved and became equivalent to those of a SAW having a single piezoelectric substrate layer. In addition, when W or Cu was included in the interlayer 32, diffusion to the piezoelectric thin film 10 started at about 650° C. or more, and when Fe, Al, or Ni was included in the interlayer 32, the diffusion started at about 700° C. or more, so that the conductivity of the piezoelectric thin film 10 was increased, and the resonance characteristics were degraded. Therefore, the heat treatment is preferably performed at a temperature at which each material included in the interlayer 32 will not diffuse to the piezoelectric thin film 10 or less, for example.

In addition, when the heat treatment was performed at about 625° C. or more, since the temperature was more than the Curie temperature (about 610° C.) of the LT substrate, the polarization was eliminated, and degradation of the piezoelectricity was generated. However, when the heat treatment temperature was about 700° C. or less, the piezoelectricity could be recovered by applying a voltage as a treatment for aligning the polarization direction while the heat treatment was performed. However, if the heat treatment temperature is about 700° C. or more, in the case of a heat treatment atmosphere including oxygen, an oxidation reaction of the substrate by heating becomes remarkably difficult to control. In addition, in a vacuum or a heat treatment atmosphere including nitrogen, since a reduction reaction by heating becomes remarkably difficult to control, the SAW device cannot be stably manufactured. Therefore, the heat treatment temperature is preferably set in a range of about 450° C. to about 700° C., for example. In addition, when the material of the piezoelectric thin film is heated at the Curie temperature or less, for example, the above treatment for aligning the polarization direction is not required, and the number of manufacturing steps is not increased. Therefore, when the piezoelectric thin film is an LT substrate, the heat treatment temperature is more preferably set in a range of about 450° C. to about 600° C., for example. The heat treatment is preferably performed in an inert gas atmosphere of nitrogen, argon, or other suitable inert gas or in a vacuum so that oxidation of the piezoelectric film does not excessively progress. In addition, the heating time is preferably set to about 3 hours or more, for example.

In addition, when the heat treatment is performed in Step 104, a substrate heat treatment for recovery of the piezoelectricity of the composite piezoelectric substrate 3 can also be simultaneously performed. That is, although the crystal receives strain by ion implantation, when the heat treatment is performed as described above, the strain of the crystal is reduced, hydrogen ions implanted to occupy Li sites in the ion implantation were removed, and Li returns to its own site, so that the piezoelectricity is recovered.

Next, a surface 13 of the piezoelectric thin film 10 formed by the separation as described above is polished by a CMP (Chemical Mechanical Planarization) treatment or other suitable method so that the surface roughness Ra is preferably about 1 nm or less, for example (FIG. 1: S106). Accordingly, the resonance characteristics of the piezoelectric device are improved.

Figure 3B:
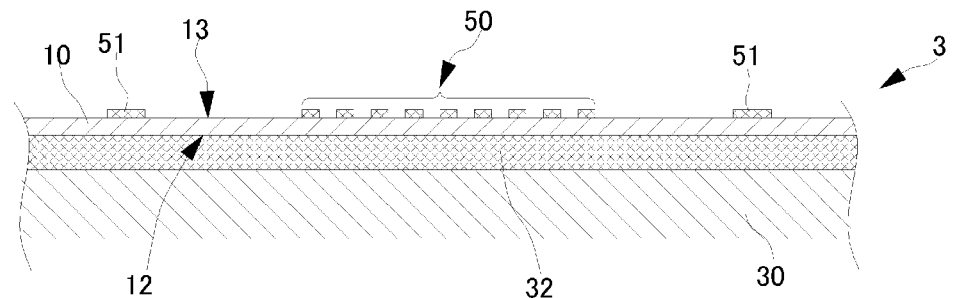

Next, as shown in FIG. 3B, an electrode pattern including an IDT electrode 50 and pad electrodes 51 is formed on the surface 13 of the piezoelectric thin film 10 (FIG. 1: S107). An electrode material is preferably selected in accordance with the characteristics required for the device.

Figure 3C:
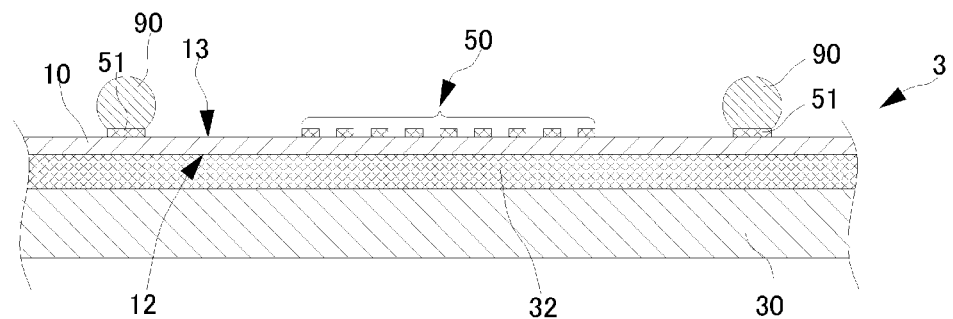
Figure 3D:
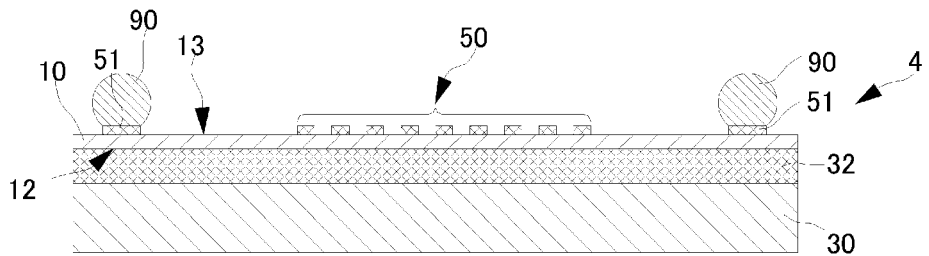

Next, as shown in FIG. 3C, bumps 90 are formed on the pad electrodes 51 (FIG. 1: S108). In addition, as shown in FIG. 3D, the composite piezoelectric substrate 3 is cut into discrete piezoelectric devices 4 (FIG. 1: S109). According to the manufacturing process as described above, a SAW device having excellent resonance characteristics is manufactured.

In addition, in the above manufacturing process of the piezoelectric device, the heat treatment step may be performed at any time after the bonding step. However, in order to avoid the diffusion of the IDT electrode into the piezoelectric film and an IDT protective film, the heat treatment is preferably performed after the bonding step and before the step of forming the IDT electrode. In addition, the heat treatment step is more preferably also performed as the separation step.

Next, a method for manufacturing a piezoelectric device according to a second preferred embodiment of the present invention will be described with reference to schematic views of a manufacturing process of the piezoelectric device along the steps shown in a flowchart. Hereinafter, as the piezoelectric device, an F-BAR (film bulk acoustic resonator) type piezoelectric device which is one type of BAW (bulk acoustic wave) device will be described.

Figure 5:
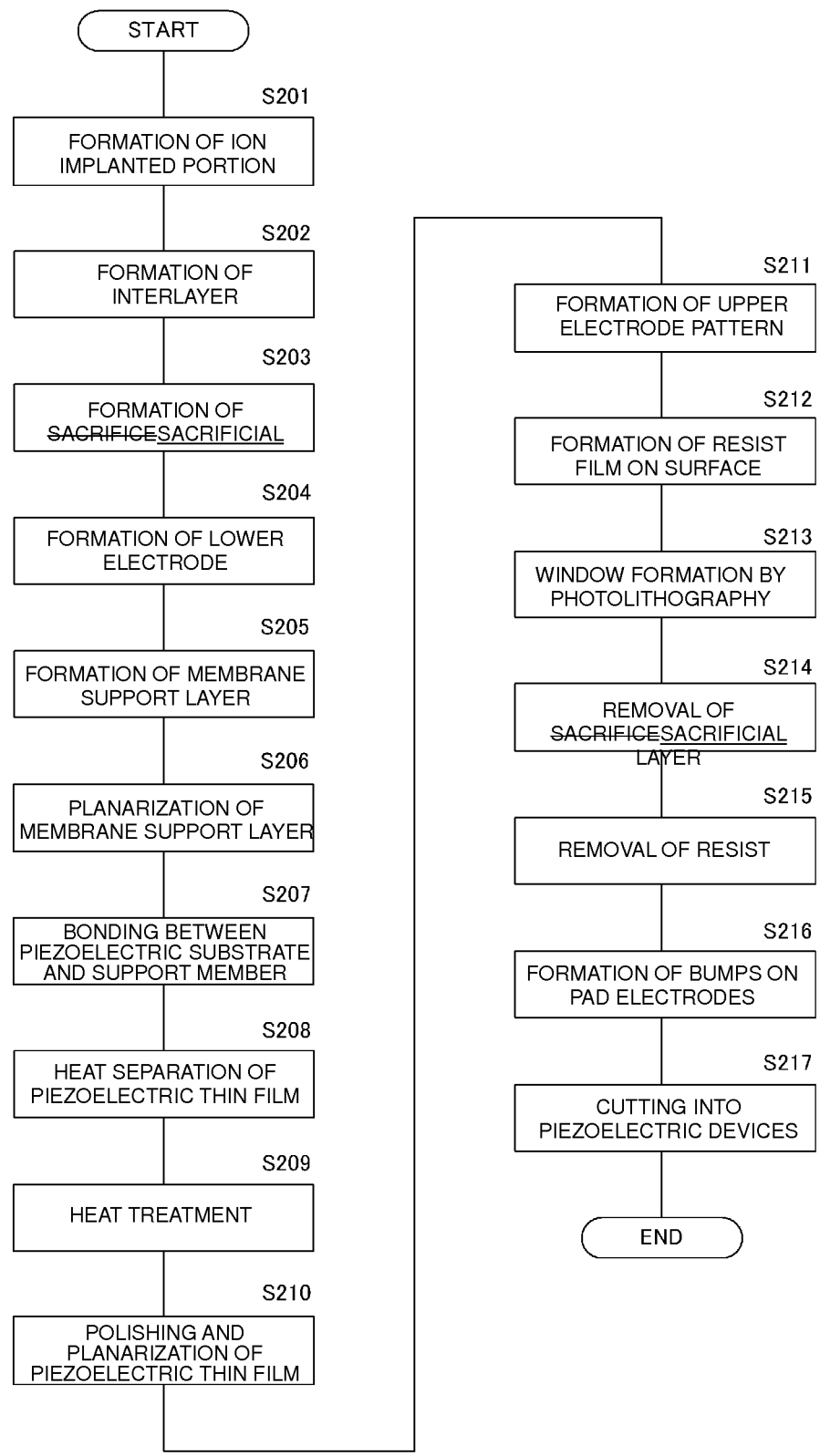
FIG. 5 is a flowchart showing a method for manufacturing a thin film piezoelectric device according to a second preferred embodiment of the present invention.

FIG. 5 is a flowchart showing the method for manufacturing a piezoelectric device according to the second preferred embodiment of the present invention. FIGS. 6A-6D, 7A-7D, and 8A-8C include schematic views showing steps of manufacturing a piezoelectric device formed along the manufacturing flow shown in FIG. 5.

In the method for manufacturing a piezoelectric device according to the second preferred embodiment, a step of forming an ion implanted portion and a step of forming an interlayer (Steps S201 and S202) are similar to Steps S101 and S102 of the method for manufacturing a piezoelectric device according to the first preferred embodiment, and description thereof is omitted.

In addition, the interlayer 32 may be formed on at least one of the bonding surface of the piezoelectric single crystal substrate 1 and a bonding surface of a membrane support layer 33 described later or both of them.

Next, a support member 35 is prepared. The support member 35 may be formed from a material similar to that of the support member 30.

Figure 6A:
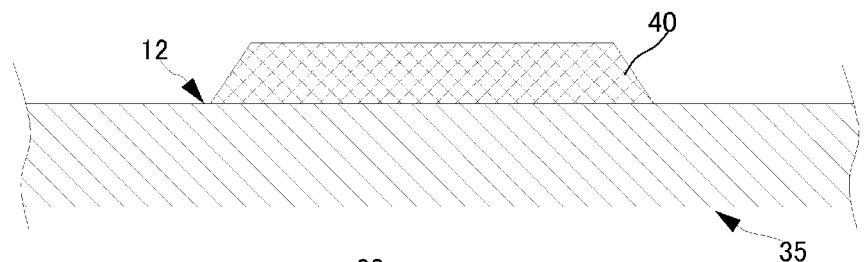
FIGS. 6A to 6D are schematic views showing a manufacturing step of the thin film piezoelectric device formed along the manufacturing flow shown in FIG. 5.

As shown in FIG. 6A, a sacrificial layer 40 is formed on an upper portion of the support member 35 (FIG. 5: S203). For the sacrificial layer 40, a material is preferably selected which is able to select an etching gas or an etching solution so as to obtain the selectivity relative to a lower electrode when the sacrificial layer is removed in a step described later. For example, a material including at least one of ZnO, Cu, W, Mo, and Ni is preferably selected as a sacrificial layer material. The sacrificial layer 40 is preferably formed, for example, by EB vacuum evaporation, sputtering, or CVD in accordance with the type of material, followed by patterning using a photolithographic technique.

Figure 6B:
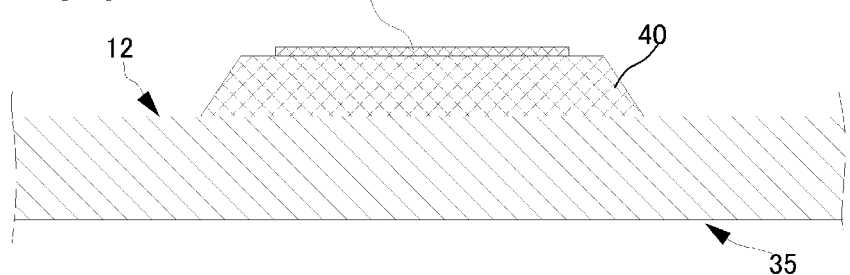

As shown in FIG. 6B, a lower electrode 20 having a predetermined thickness is formed on an upper portion of the sacrificial layer 40 (FIG. 5: S204). As an electrode material, in accordance with the characteristics required for the device, a material including at least one of W, Mo, Ni, Cu, Pt, and Ru, for example, is preferably used. In addition, in accordance with the type of electrode material, the lower electrode is preferably formed, for example, by EB vacuum evaporation, sputtering, or CVD, followed by patterning using a photolithographic technique.

Figure 6C:
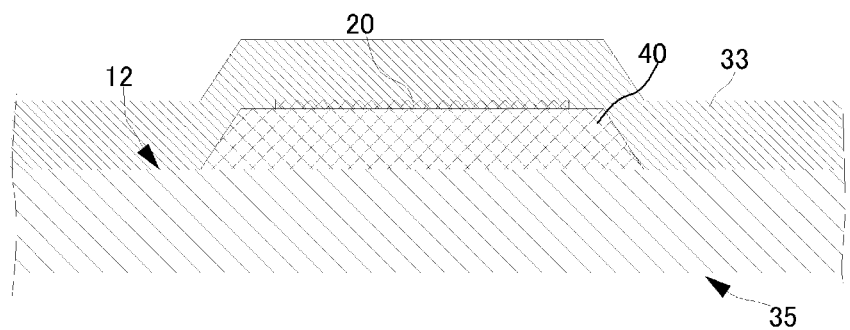

As shown in FIG. 6C, the membrane support layer 33 is formed on the upper portion of the support member 35 and that of the lower electrode 20 (FIG. 5: S205). The membrane support layer 33 may preferably be formed from $SiO_2$ or SiN by sputtering or CVD, for example.

Figure 6D:
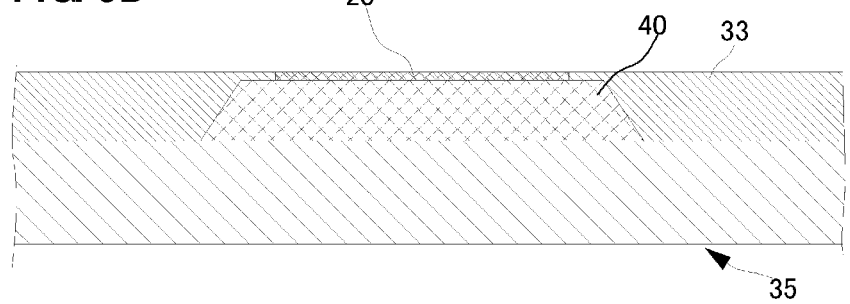

As shown in FIG. 6D, the surface of the membrane support layer 33 is polished and planarized, for example, by a CMP treatment until a step formed on the lower electrode is removed (FIG. 5: S206).

Figure 7A:
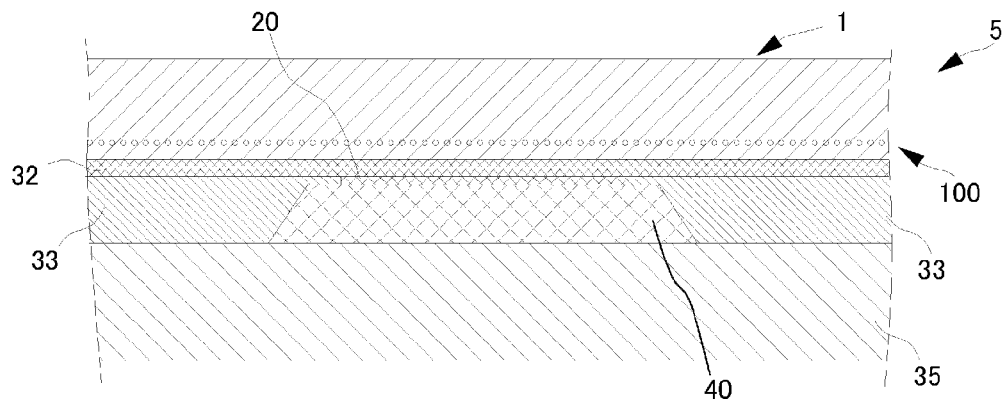
FIGS. 7A to 7D are schematic views showing a manufacturing step of the thin film piezoelectric device formed along the manufacturing flow shown in FIG. 5.

As shown in FIG. 7A, the interlayer 32 formed on the piezoelectric single crystal substrate 1 and the membrane support layer 33 formed on the support member 35 are directly bonded in a vacuum preferably using a clean bonding technique, so that a composite piezoelectric body 5 is formed (FIG. 5: S207).

Figure 7B:
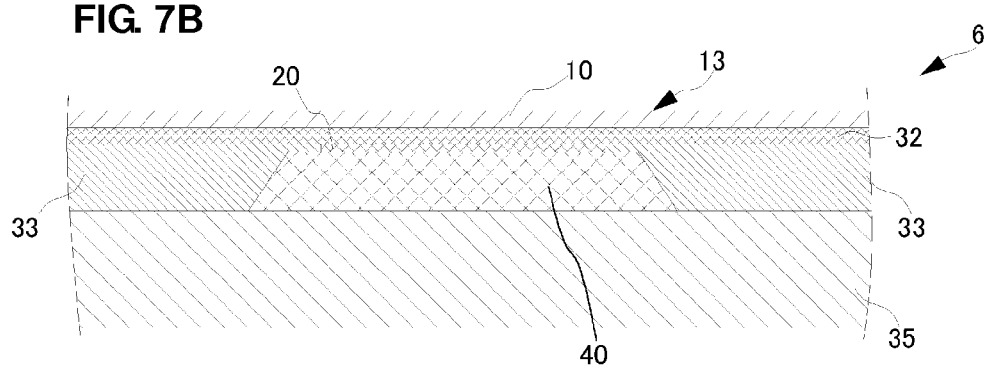

In the method for manufacturing a piezoelectric device according to the second preferred embodiment, a separation step of a piezoelectric thin film, a heat treatment step, and a planarization step of the piezoelectric thin film shown in FIG. 7B (Steps S208 to S210) are similar to Step S104 to S106 of the method for manufacturing a piezoelectric device according to the first preferred embodiment. Therefore, description thereof is omitted.

Figure 7C:
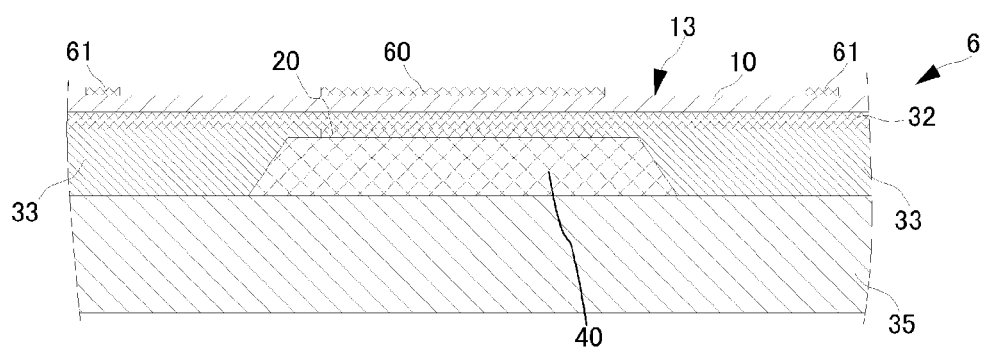

As shown in FIG. 7C, in a composite piezoelectric substrate 6, an upper surface electrode pattern including an upper electrode 60 and pad electrodes 61 is formed on the surface 13 of the piezoelectric thin film 10 (FIG. 5: S211). As is the case of the lower electrode 20, an electrode material is preferably selected in accordance with the characteristics required for the device.

Figure 7D:
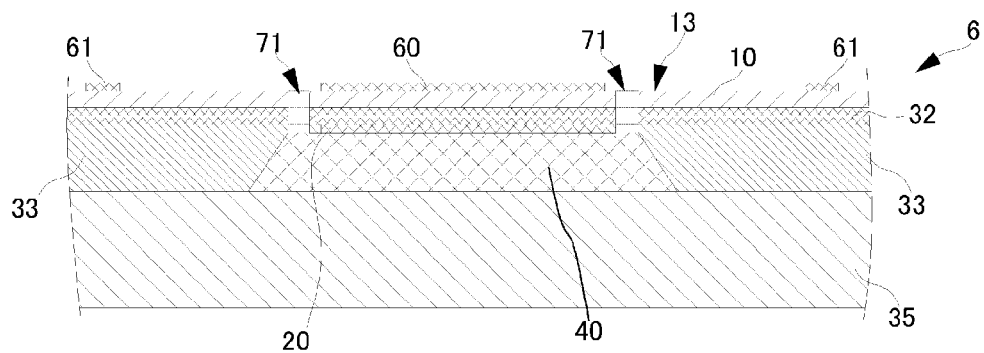

Next, a resist film (not shown) is formed on the surface 13 of the piezoelectric thin film 10 on which the upper electrode 60 is formed (FIG. 5: S212). In addition, by using a photolithographic technique, as shown in FIG. 7D, etching windows 71 for removing the sacrificial layer are formed in the resist film (FIG. 5: S213).

Next, the sacrificial layer 40 is preferably removed by introducing an etching gas or an etching solution through the etching windows 71 (FIG. 5: S214). Accordingly, a space in which the sacrificial layer 40 is formed, which corresponds to a region in which the lower electrode 20 and the upper electrode 60 of a single piezoelectric device are formed, becomes a void layer 80. A wet etching solution or an etching gas which has no adverse influences on the membrane support layer 33, the upper electrode 60, and the lower electrode 20 is preferably selected.

The resist film is removed after the sacrificial layer 40 is removed (FIG. 5: S215).

Figure 8A:
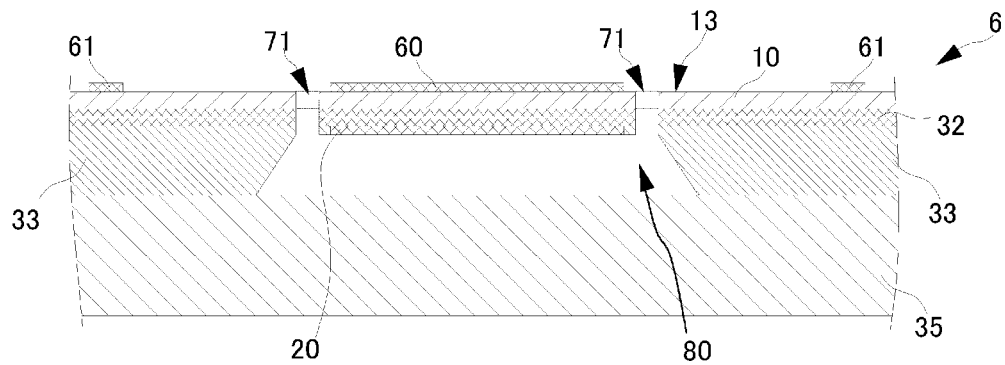
FIGS. 8A to 8C are schematic views each showing a manufacturing step of the thin film piezoelectric device formed along the manufacturing flow shown in FIG. 5.
Figure 8B:
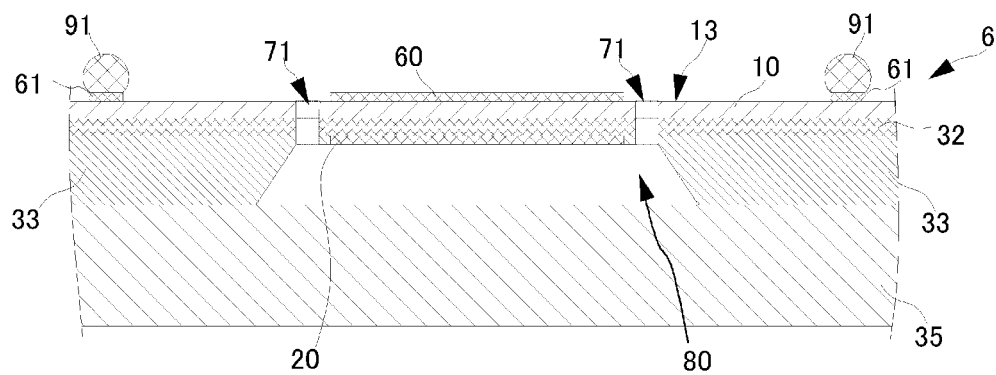
Figure 8C:
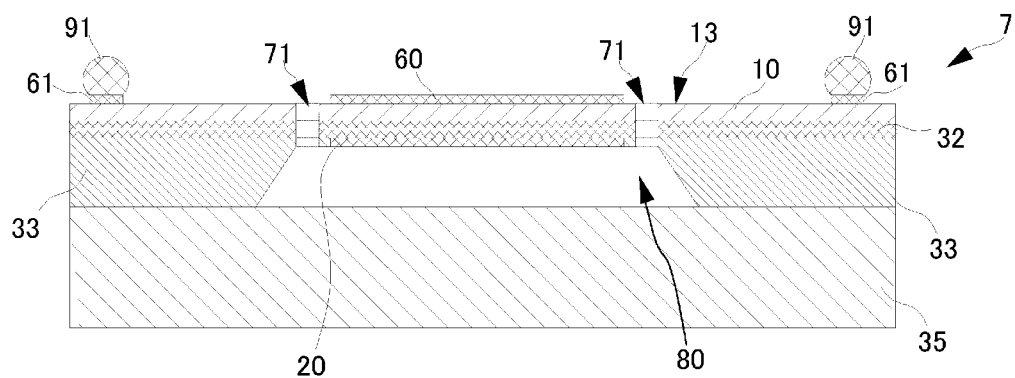

Next, as shown in FIG. 8B, bumps 91 are formed on the pad electrodes 61 (FIG. 5: S216). In addition, as shown in FIG. 8C, the composite piezoelectric substrate 6 is cut into discrete piezoelectric devices 7 (FIG. 5: S217). By the manufacturing process as described above, an F-BAR type piezoelectric device having excellent resonance characteristics can be manufactured.

In addition, besides an F-BAR and a surface acoustic wave device, the method for manufacturing a piezoelectric device according to preferred embodiments of the present invention may also be applied to various piezoelectric devices. For example, preferred embodiments of the present invention may also be applied to a piezoelectric vibration motor, a gyroscope, and other suitable piezoelectric devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
   a piezoelectric thin film on which an electrode is provided; and
   a support member arranged to support the piezoelectric thin film; wherein
   the piezoelectric device includes an interlayer which includes an oxidized or a nitrided metal and which is provided between the piezoelectric thin film and the support member, and
   the piezoelectric thin film has a conductivity of about $1.0 \times 10^{-13}$ $\Omega^{-1} \cdot m^{-1}$ to about $1.0 \times 10^{-11}$ $\Omega^{-1} \cdot m^{-1}$.

2. The piezoelectric device according to claim 1, wherein the electrode is an IDT electrode.

3. The piezoelectric device according to claim 2 wherein the oxidized or the nitrided metal includes at least one element selected from Fe, Cr, Ni, Al, W, and Cu.

4. The piezoelectric device according to claim 2 wherein the interlayer has a thickness of about 2 nm to about 25 nm.

5. The piezoelectric device according to claim 2 wherein the piezoelectric thin film includes lithium tantalate or lithium niobate.

6. The piezoelectric device according to claim 2, wherein the interlayer is not diffused into the piezoelectric thin film.

7. The piezoelectric device according to claim 1, wherein the piezoelectric thin film is a single crystal piezoelectric thin film.

8. The piezoelectric device according to claim 1, wherein the interlayer is not diffused into the piezoelectric thin film.

* * * * *